US012575336B2

(12) United States Patent
Chiu et al.

(10) Patent No.: US 12,575,336 B2
(45) Date of Patent: Mar. 10, 2026

(54) SEMICONDUCTOR INTEGRATED CIRCUIT DEVICE AND MANUFACTURING METHOD THEREFOR

(71) Applicant: XIAMEN INDUSTRIAL TECHNOLOGY RESEARCH INSTITUTE CO., LTD., Xiamen (CN)

(72) Inventors: Taiwei Chiu, Xiamen (CN); Lijun Shan, Xiamen (CN); Tingying Shen, Xiamen (CN)

(73) Assignee: XIAMEN INDUSTRIAL TECHNOLOGY RESEARCH INSTITUTE CO., LTD., Xiamen (CN)

( * ) Notice: Subject to any disclaimer, the term of this patent is extended or adjusted under 35 U.S.C. 154(b) by 388 days.

(21) Appl. No.: 18/329,540

(22) Filed: Jun. 5, 2023

(65) Prior Publication Data

US 2023/0320238 A1      Oct. 5, 2023

Related U.S. Application Data

(63) Continuation of application No. PCT/CN2022/093538, filed on May 18, 2022.

(30) Foreign Application Priority Data

May 21, 2021      (CN) .......................... 202110559332.3

(51) Int. Cl.
| | |
|---|---|
| *H10N 70/20* | (2023.01) |
| *H10B 63/00* | (2023.01) |
| *H10N 70/00* | (2023.01) |

(52) U.S. Cl.
CPC ............. *H10N 70/20* (2023.02); *H10B 63/20* (2023.02); *H10N 70/011* (2023.02); *H10N 70/826* (2023.02); *H10N 70/841* (2023.02)

(58) Field of Classification Search
CPC .... H10N 70/20; H10N 70/011; H10N 70/826; H10N 70/841; H10N 70/061; H10B 63/20; H10B 63/80
See application file for complete search history.

(56) References Cited

U.S. PATENT DOCUMENTS

| | | |
|---|---|---|
| 7,244,662 B2 | 7/2007 | Kondo |
| 10,014,253 B2 | 7/2018 | Harada |
| (Continued) | | |

FOREIGN PATENT DOCUMENTS

| | | |
|---|---|---|
| CN | 102110641 A | 6/2011 |
| CN | 104051617 A | 9/2014 |
| (Continued) | | |

OTHER PUBLICATIONS

Markeev, A., et al. "Multilevel resistive switching in ternary HFxAl1-x oxide with graded Al depth profile." Microelectronic Engineering, vol. 109, Sep. 2013, pp. 342-345, https://doi.org/10.1016/j.mee. 2013.03.084. (Year: 2013).*

(Continued)

*Primary Examiner* — J. E. Schoenholtz

(57) ABSTRACT

The present disclosure provides a semiconductor integrated circuit device and a manufacturing method therefor. In the device, an electrode in a resistive random-access memory (RRAM) cell is directly connected to a metal layer, thereby omitting the steps of filling a connection via with other metal materials (such as tungsten) and of polishing. The manufacturing process is hence simplified, and different degrees of depressions caused by polishing are correspondingly reduced. The uniformity of resistive performance of the RRAM and the quality of the semiconductor integrated circuit device are hence greatly improved. In addition, a resistive layer having a trench structure is formed by using a trench where an original connection via is located, thereby embedding the entire RRAM cell into the trench. The (Continued)

structure of the RRAM cell is more compact, a gap between RRAM cells is smaller, and the requirements for miniaturization and high density can thus be better met.

12 Claims, 11 Drawing Sheets

(56)                    References Cited

U.S. PATENT DOCUMENTS

| | | | |
|---|---|---|---|
| 2010/0155687 A1 | 6/2010 | Reyes et al. | |
| 2014/0264234 A1* | 9/2014 | Tu | H10N 70/063 |
| | | | 257/4 |
| 2015/0028281 A1* | 1/2015 | Chen | H10N 70/24 |
| | | | 257/4 |
| 2019/0123270 A1* | 4/2019 | Mo | H10B 63/30 |

FOREIGN PATENT DOCUMENTS

| | | | |
|---|---|---|---|
| CN | 105514264 A | 4/2016 | |
| CN | 109256462 A | 1/2019 | |
| CN | 109411601 A | 3/2019 | |
| CN | 111640863 A | 9/2020 | |
| CN | 111640864 A | 9/2020 | |
| CN | 111769196 A | 10/2020 | |
| CN | 112467029 A | 3/2021 | |
| CN | 113380947 A | 9/2021 | |

OTHER PUBLICATIONS

Vinuesa, G., et al. "Effective control of filament efficiency by means of spacer HfAlOx layers and growth temperature in HfO2 based RERAM devices." Solid-State Electronics, vol. 183, Sep. 2021, p. 108085, https://doi.org/10.1016/j.sse.2021.108085. (Year: 2021).*

* cited by examiner

103

102

101

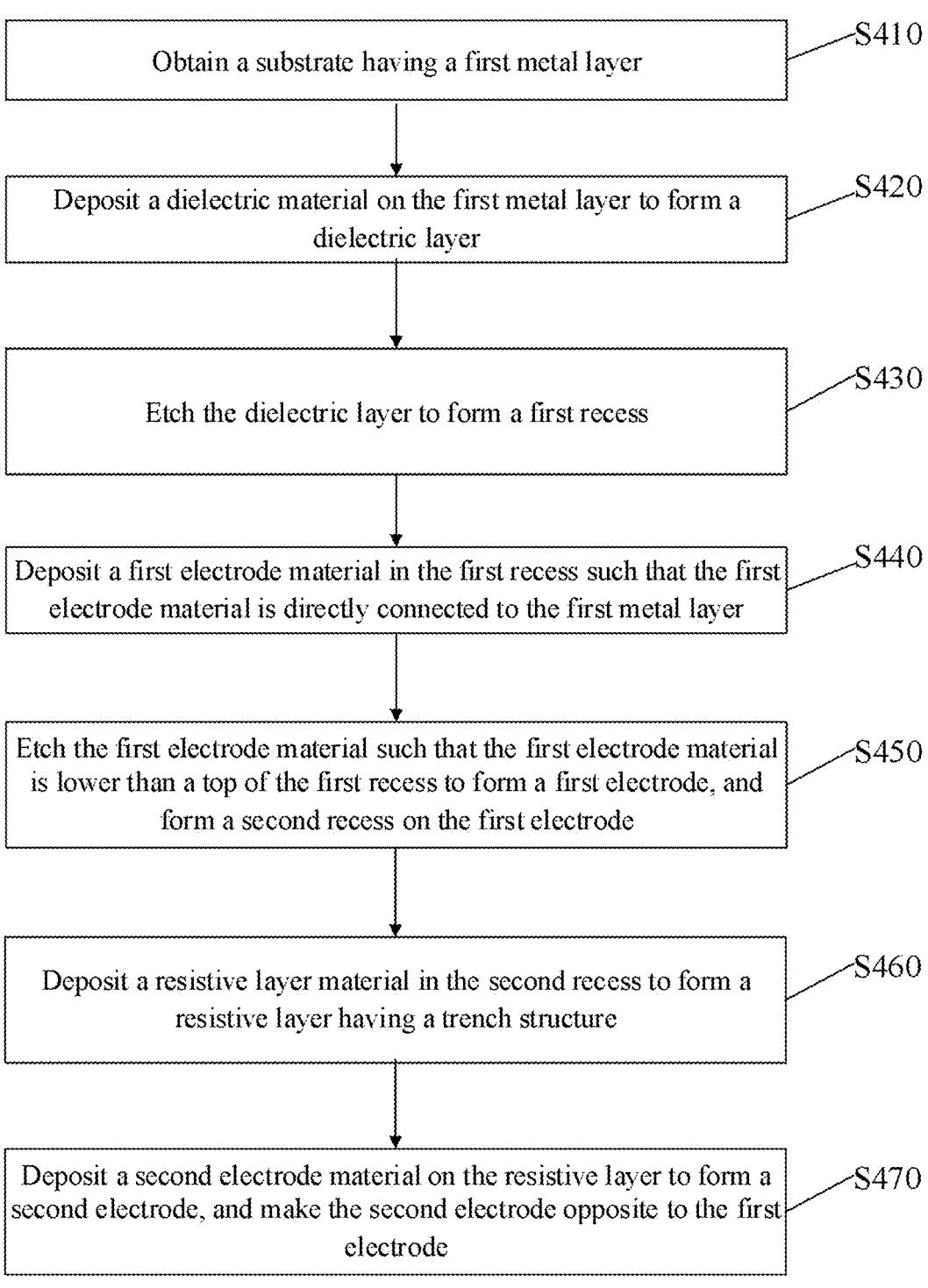

Obtain a substrate having a first metal layer ~S410

Deposit a dielectric material on the first metal layer to form a dielectric layer ~S420

Etch the dielectric layer to form a first recess ~S430

Deposit a first electrode material in the first recess such that the first electrode material is directly connected to the first metal layer ~S440

Etch the first electrode material such that the first electrode material is lower than a top of the first recess to form a first electrode, and form a second recess on the first electrode ~S450

Deposit a resistive layer material in the second recess to form a resistive layer having a trench structure ~S460

Deposit a second electrode material on the resistive layer to form a second electrode, and make the second electrode opposite to the first electrode ~S470

SEMICONDUCTOR INTEGRATED CIRCUIT DEVICE AND MANUFACTURING METHOD THEREFOR

CROSS-REFERENCE TO RELATED APPLICATIONS

This application is a continuation of International Patent Application No. PCT/CN2022/093538 with a filing date of May 18, 2022, designating the United States, and further claims priority to Chinese Patent Application No. 202110559332.3 with a filing date of May 21, 2021. The contents of the aforementioned applications, including any intervening amendments thereto, are incorporated herein by reference for all purposes.

TECHNICAL FIELD

The present disclosure relates to the field of semiconductor devices, and in particular, to a resistance/resistive random-access memory (RRAM) and a manufacturing method therefor.

BACKGROUND

The RRAM has unique characteristics of fast speed, high reliability, non-volatility, high density, multi-valued storage and the like, which can better meet the needs in existing emerging application fields. The RRAM has thus attracted more and more attention and has become a research hotspot in the field of semiconductors in recent years.

In particular, the RRAM generally adopts a stacked structure to further improve the space utilization of the RRAM to meet the increasingly growing demand for miniaturization. In this case, it is often necessary to connect upper and lower adjacent RRAMs.

At present, a connection via having a columnar structure is usually employed to connect between upper and lower metal layers, and the connection via is usually formed by depositing a metal material, such as metal tungsten (W). Correspondingly, the layer structure provided with the connection via is also called a metal contact layer.

The inventors of the present disclosure found that when the size of particles added to the connection via is relatively large, different degrees of depressions are formed after a chemical mechanical polishing (CMP) process is employed to polish, thereby affecting the uniformity of the resistive performance, especially forming/set/reset operation conditions, of the RRAM.

Therefore, how to avoid the formation of different degrees of depressions in the metal contact layer and further improve the uniformity of resistive performance of the RRAM has become a technical problem that needs to be solved urgently.

SUMMARY

Regarding the above technical problems, embodiments of the present disclosure provides a semiconductor integrated circuit device and a manufacturing method therefor.

In one aspect, the present disclosure provides a semiconductor integrated circuit device. The semiconductor integrated circuit device includes: a first metal layer; and a resistive random-access memory (RRAM) cell including a resistive layer, a first electrode, and a second electrode, where the resistive layer has a trench structure, the first electrode and the second electrode are respectively located on upper and lower sides of the trench structure and are opposite to each other, and the first electrode is directly connected to the first metal layer.

In one embodiment, a material of the first electrode includes at least one of titanium, tantalum, titanium nitride, or tantalum nitride.

In one embodiment, a length of the second electrode is less than a length of the first electrode.

In one embodiment, the RRAM cell further includes: an oxygen getting layer located between the resistive layer and the second electrode.

In another aspect, the present disclosure provides a method for manufacturing a semiconductor integrated circuit device. The method includes: obtaining a substrate having a first metal layer; depositing a dielectric material on the first metal layer to form a dielectric layer; etching the dielectric layer to form a first recess; depositing a first electrode material in the first recess such that the first electrode material is directly connected to the first metal layer; etching the first electrode material such that the first electrode material is lower than a top of the first recess to form a first electrode, and forming a second recess on the first electrode; depositing a resistive material in the second recess to form a resistive layer having a trench structure; and depositing a second electrode material on the resistive layer to form a second electrode, and making the second electrode opposite to the first electrode.

In one embodiment, the depositing the first electrode material in the first recess includes: depositing the first electrode material in the first recess by means of a chemical vapor deposition process or an atomic deposition process.

In one embodiment, before depositing the second electrode material on the resistive layer to form the second electrode, the method further includes: depositing an oxygen getting layer material on the resistive layer to form an oxygen getting layer, correspondingly, the depositing the second electrode material on the resistive layer to form the second electrode includes: depositing the second electrode material on the oxygen getting layer to form the second electrode.

In one embodiment, the depositing the second electrode material on the resistive layer to form the second electrode includes: depositing the second electrode material on the resistive layer; and removing a structure on the dielectric layer to form the second electrode, and making a RRAM cell flush with the dielectric layer.

In one embodiment, the depositing the second electrode material on the resistive layer includes: depositing the second electrode material on the resistive layer by means of a chemical vapor deposition process or an atomic deposition process.

In one embodiment, the removing the structure on the dielectric layer includes: removing the structure on the dielectric layer by means of a chemical mechanical polishing (CMP) process.

The embodiments of the present disclosure provide a semiconductor integrated circuit device and a manufacturing method therefor. In the semiconductor integrated circuit device, an electrode in the RRAM cell is directly connected to a metal layer, thereby omitting the steps of filling a connection via with other metal materials (such as tungsten) and performing polishing.

In this way, the manufacturing process is simplified, and different degrees of depressions caused by polishing are also correspondingly reduced. In this way, the uniformity of resistive performance of the RRAM and the quality of the semiconductor integrated circuit device are greatly improved.

In addition, according to embodiments of the present disclosure, a resistive layer having a trench structure is formed by using a trench where an original connection via is located, thereby embedding the entire RRAM cell into the trench. In this way, the structure of a single RRAM cell is more compact, a gap between RRAM cells is smaller, and the requirements for miniaturization and high density can thus be better met.

It should be understood that the implementation of the embodiments of the present disclosure does not need to achieve all the beneficial effects above, but specific technical solutions can achieve specific technical effects, and other implementations of the embodiments of the present disclosure can also achieve beneficial effects not mentioned above.

BRIEF DESCRIPTION OF THE DRAWINGS

The above objectives, features and advantages of the embodiments of the present disclosure will become more comprehensible by referring to the accompanying drawings and the following detailed description. In the accompanying drawings, a plurality of implementations of the present disclosure will be shown by way of example in a non-limiting manner.

In the accompanying drawings, the same or corresponding numerals represent the same or corresponding parts.

FIG. 4 is a schematic diagram showing a manufacturing process of a semiconductor integrated circuit device according to an embodiment of the present disclosure;

DETAILED DESCRIPTION OF THE EMBODIMENTS

In order to make the objectives, features and advantages of the present disclosure more obvious and easier to understand, the technical solutions in the embodiments of the present disclosure will be clearly and completely described below with reference to the accompanying drawings in the embodiments of the present disclosure. Obviously, the described embodiments are only some embodiments of the present disclosure, and not all embodiments. All other embodiments obtained by those skilled in the art based on the embodiments of the present disclosure without creative efforts should fall within the protection scope of the present disclosure.

In the description of this specification, the description with reference to the terms such as "one embodiment", "some embodiments", "an example", "a specific example", or "some examples", etc. means that the specific features, structures, materials, or characteristics described with reference to the embodiment or example are included in at least one embodiment or example of the present disclosure. Moreover, the specific features, structures, materials or characteristics described may be combined in a suitable manner in any one or more embodiments or examples. In addition, those skilled in the art may combine different embodiments or examples described in this specification and characteristics of the different embodiments or examples without mutual contradiction.

In addition, the terms "first" and "second" are merely intended for a purpose of description, and shall not be understood as an indication or implication of relative importance or implicit indication of a quantity of indicated technical features. Therefore, features defined by "first" and "second" may explicitly or implicitly include at least one of the features. In the description of the present disclosure, "multiple" means two or more, unless otherwise specifically defined.

Figure 1:
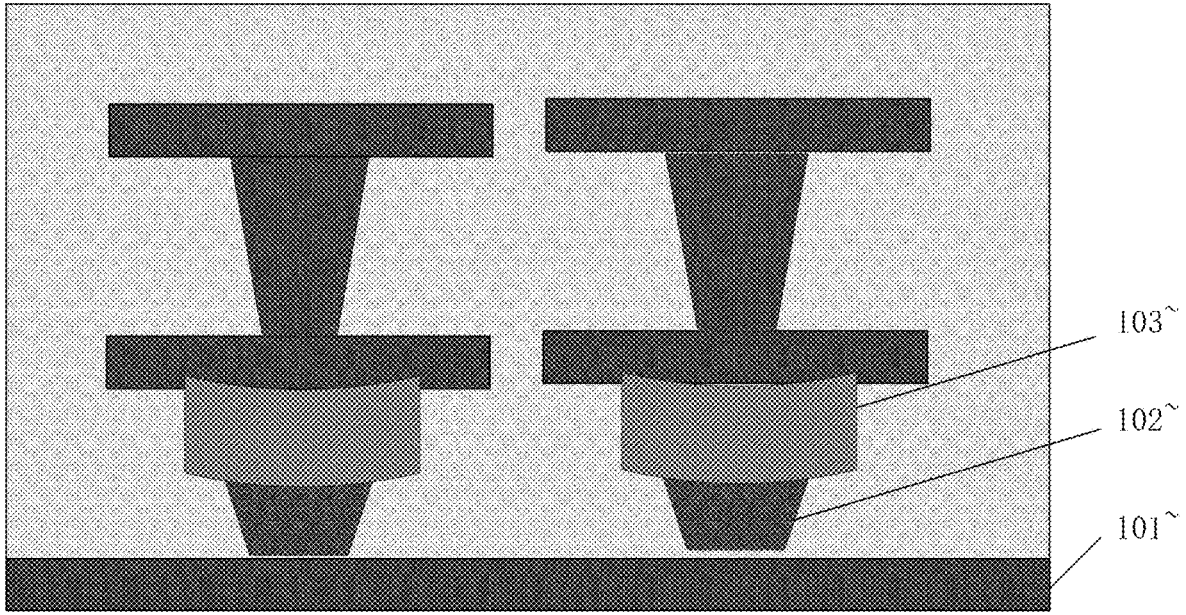
FIG. 1 is a schematic diagram showing a stacked structure of a RRAM in a prior art.

FIG. 1 shows a common stacked structure of a RRAM in the prior art. A substrate having a metal layer 101~ is at the bottom. A connection via 102~ is provided on the metal layer and is formed by adding metal tungsten (W). A RRAM cell 103~ is connected to the connection via 102~, other metal material layers are also connected to the RRAM cell 103~, and the metal layers are also connected through a connection via of a metal material.

Figure 2:
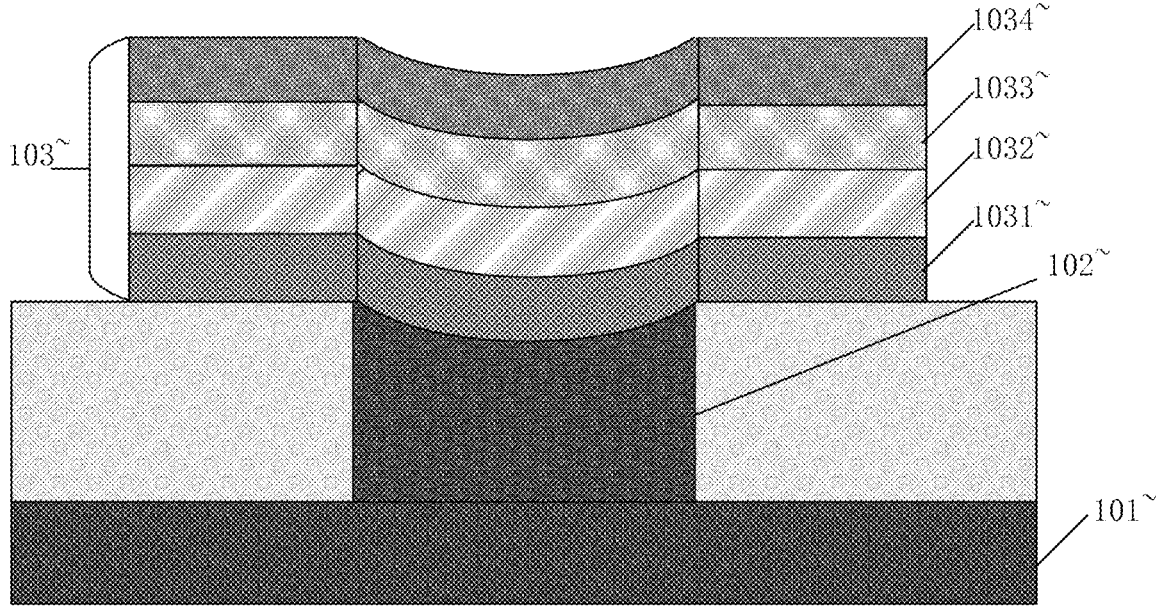
FIG. 2 is a schematic cross-sectional diagram showing that a certain RRAM cell and a metal layer are connected by a connection via in the RRAM according to FIG. 1.

Furthermore, FIG. 2 is a schematic cross-sectional diagram showing that the RRAM cell 103~ and the metal layer 101~ are connected by the connection via 102~ in the RRAM according to FIG. 1. The RRAM cell 103~ includes a first electrode 1031~, a resistive layer 1032~, an oxygen getting layer 1033~, and a second electrode 1034~. As shown in FIG. 2, the connection via 102~ is formed by adding a metal material (such as tungsten). Before the RRAM cell 103~ on the connection via 102~ is manufactured, the connection via 102~ requires chemical machine polishing. However, since the metal material having a relatively large particle size such as tungsten is not arranged very tightly during deposition, a depression as shown at a top end of the connection via 102~ will appear after the chemical machine polishing, which may continuously affect the subsequent manufacturing process, such that depressions are also generated on the first electrode 1031~, the resistive layer 1032~, the oxygen getting layer 1033~, and the second electrode 1034~ formed sequentially.

In addition, the degree of depression usually depends on the arrangement of the metal material such as tungsten during deposition, and the arrangement of the metal material such as tungsten during deposition has great randomness. Therefore, the degree of depression formed in each RRAM cell shown in FIG. 1 is also different, finally the surface of the RRAM having a stacked structure shown in FIG. 1 is very rough, and the uniformity of resistive performance is relatively poor, which in turn affects the uniformity of resistive performance of the RRAM.

To solve the above problems, the embodiments of the present disclosure provide a semiconductor integrated circuit device. The semiconductor integrated circuit device includes: a first metal layer 101; and a RRAM cell including a resistive layer 1032, a first electrode 1031, and a second electrode 1034, where the resistive layer 1032 has a trench structure, the first electrode 1031 and the second electrode 1034 are respectively located on upper and lower sides of the trench structure and are opposite to each other, and the first electrode 1031 is directly connected to the first metal layer 101.

The first metal layer 101 may be a metal layer formed by various circuits carried on the substrate, or may also be a metal layer formed by some components in other semiconductor integrated circuit devices in the stacked structure.

The resistive layer 1032 may be made of one or more of any suitable resistive material, such as hafnium oxide (HfOx), aluminum oxide (AlOx), aluminum hafnium oxide (HfAlO), tantalum oxide (TaOx) or the like.

The first electrode 1031 and the second electrode 1034 may be made of any suitable electrode material. The first electrode 1031 and the second electrode 1034 may be made of one material, or may be made of several electrode materials combined in different arrangements. Common electrode materials include titanium (Ti), tantalum (Ta), titanium nitride (TiN), tantalum nitride (TaN), etc.

Figure 3:
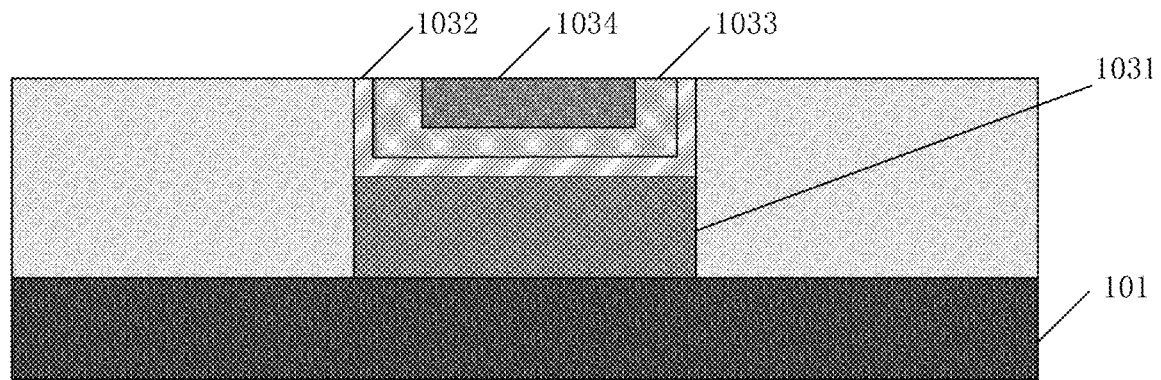
FIG. 3 is a schematic cross-sectional diagram showing a semiconductor integrated circuit device according to an embodiment of the present disclosure.

It should be noted that, in the semiconductor integrated circuit device in the embodiments of the present disclosure shown in FIG. 3, the first electrode is a bottom electrode, but in practical applications, the first electrode may also be a top electrode, or any one of two electrodes in other layout structures.

By comparing the semiconductor integrated circuit device structure commonly used in the prior art shown in FIG. 2 with the semiconductor integrated circuit device in the embodiments of the present disclosure shown in FIG. 3, it can be seen that the semiconductor integrated circuit device in the embodiments of the present disclosure does not employ other metal materials, such as tungsten (W), to fill the connection via, and does not need to polish the other metal materials, but employs a first electrode material instead of the other metal materials to directly connect to the first metal layer. In this way, the depression shown at the top end of the connecting via 102˜ in FIG. 2 is not formed, thereby improving the uniformity of resistive performance of the RRAM and making the resistive performance better.

In addition, since an electrode structure formed by adding the first electrode material into a recess accommodating an original connection via is simpler and has fewer interfaces, the negative impact of the generated interface effect is correspondingly reduced.

Moreover, according to the embodiments of the present disclosure, the resistive layer having a trench structure is formed by using a trench where the original connection via is located, thereby embedding the entire RRAM cell into the trench where the original connection via is located, such that the height of a single RRAM cell is lower, a gap between RRAM cells is smaller, and the requirements for miniaturization and high density can thus be better met.

On the other hand, in view of a process for manufacturing a semiconductor integrated circuit device, since the steps of filling the connection via with other metal materials, such as tungsten (W), and performing polishing are omitted, the manufacturing processes can also be simplified correspondingly.

In an implementation, a material of the first electrode includes at least one of titanium (Ti), tantalum (Ta), tantalum nitride (TiN), or tantalum nitride (TaN).

Due to the small particle size of the above electrode material, an amorphous structure having good step coverage can be obtained through an appropriate manufacturing process, such as a chemical vapor deposition process or an atomic vapor deposition process, thereby forming a flatter surface, which can overcome the problems of non-uniform resistive performance and poor quality caused by the depression surface.

In an implementation, as shown in FIG. 3, a length of the second electrode 1034 is less than a length of the first electrode 1031.

In the semiconductor integrated circuit device shown in FIG. 3, the length of the electrode refers to a distance from the leftmost end to the rightmost end in the horizontal direction. When the length of the second electrode is less than the length of the first electrode, the electric field is more concentrated, such that the resistive performance of the RRAM cell is better.

In an implementation, as shown in FIG. 3, the RRAM cell further includes: an oxygen getting layer 1033 located between the resistive layer 1032 and the second electrode 1034.

The oxygen getting layer can attract or store more oxygen, such that the formation of conductive filaments is more stable, thereby enhancing the resistive performance of the RRAM cell.

The embodiments of the present disclosure further provide a method for manufacturing a semiconductor integrated circuit device. As shown in FIG. 4, the method includes the following steps.

Step S410, obtain a substrate having a first metal layer 101.

The substrate is a clean single-crystal flake having a specific crystal plane and appropriate electrical, optical and mechanical properties for growing an epitaxial layer. The first metal layer 101 mainly includes various circuits communicated with a power supply. After the circuit is electrically communicated with the first electrode and the second electrode, a voltage can be applied after electrification to form the conductive filaments.

Figure 5:
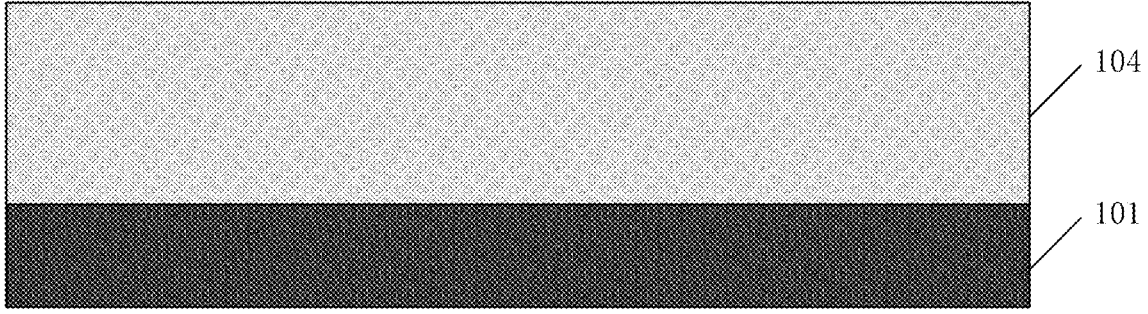
FIG. 5 is a schematic cross-sectional diagram showing a semiconductor integrated circuit device in a certain phase of a manufacturing process according to an embodiment of the present disclosure.

Step S420, deposit a dielectric material on the first metal layer 101 to form a dielectric layer 104 to obtain a structure shown in FIG. 5.

The dielectric material may be any suitable dielectric material, such as silicon oxide, silicon nitride, ultra-low-k (ULK) dielectric material or the like.

Figure 6:
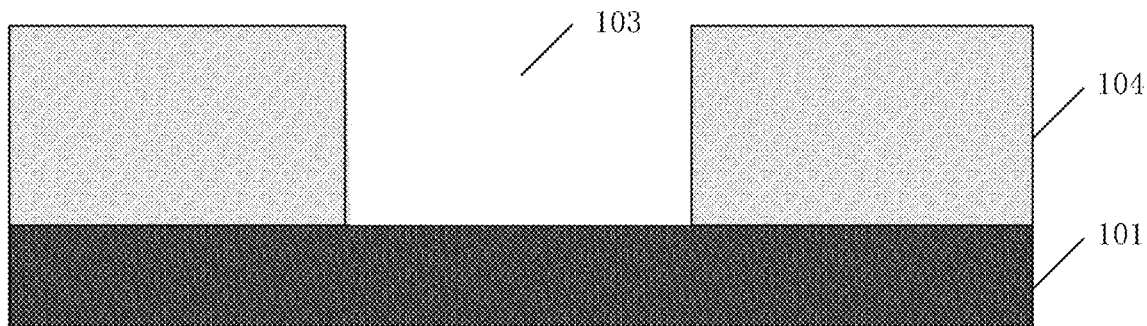
FIG. 6 is a schematic cross-sectional diagram showing a semiconductor integrated circuit device in a certain phase of a manufacturing process according to an embodiment of the present disclosure.

Step S430, etch the dielectric layer 104 to form a first recess 103 to obtain a structure shown in FIG. 6.

The recess etching can be done by adopting any suitable process, for example, photolithography followed by etching according to a pre-designed pattern or shape.

Figure 7:
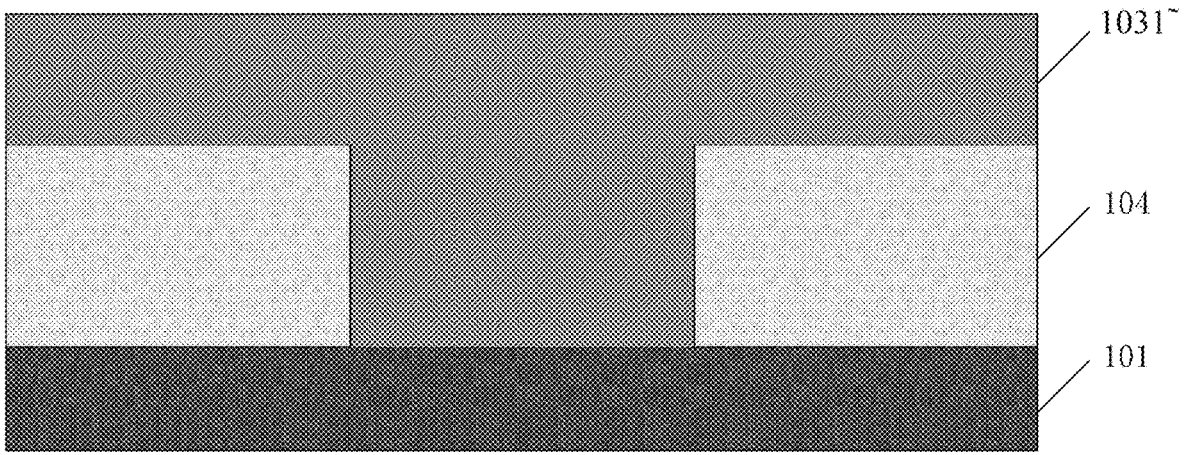
FIG. 7 is a schematic cross-sectional diagram showing a semiconductor integrated circuit device in a certain phase of a manufacturing process according to an embodiment of the present disclosure.

Step S440, deposit a first electrode material 1031˜ in the first recess 103 such that the first electrode material 1031˜ is directly connected to the first metal layer 101 to obtain a structure shown in FIG. 7.

When depositing the first electrode material in the first recess 103, any applicable electrode material can be deposited by adopting any applicable deposition method. Common deposition methods include chemical vapor deposition, physical vapor deposition, atomic layer deposition, etc. Common electrode materials include titanium (Ti), tantalum (Ta), titanium nitride (TiN), tantalum nitride (TaN), etc.

In an implementation, the first electrode material can be deposited in the first recess 103 by means of the chemical vapor deposition process or the atomic deposition process.

Usually, the electrode layer deposited by means of the physical vapor deposition method has a crystalline structure and a relatively rough surface. When the particle size of the metal material used is relatively large, there may exist filling voids, resulting in an increase in capacitance and resistance, and also negatively affecting the resistive performance of the RRAM cell. However, the electrode layer obtained by means of the chemical vapor deposition or atomic deposition process has an amorphous structure and a relatively flat surface. Therefore, it is more beneficial to improve the uniformity of resistive performance of the RRAM cell.

Figure 8:
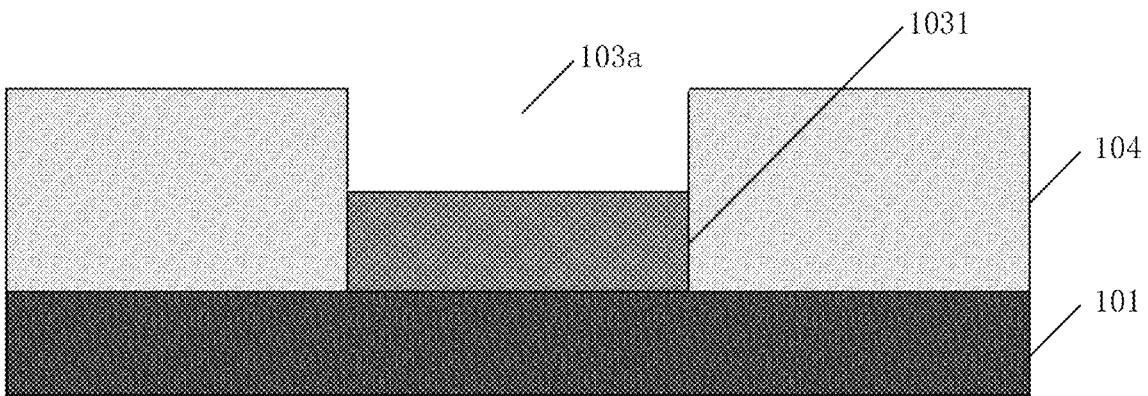
FIG. 8 is a schematic cross-sectional diagram showing a semiconductor integrated circuit device in a certain phase of a manufacturing process according to an embodiment of the present disclosure.

Step S450, etch the first electrode material 1031˜ such that the first electrode material 1031˜ is lower than a top of the first recess 103 to form a first electrode 1031, and form a second recess 103a on the first electrode 1031 to obtain a structure shown in FIG. 8.

When etching the first electrode material 1031˜, a dry etching (DryEtec), wet etching (WetEtec) or CMP process may be adopted to form the second recess 103a on the first electrode 1031.

Figure 9:
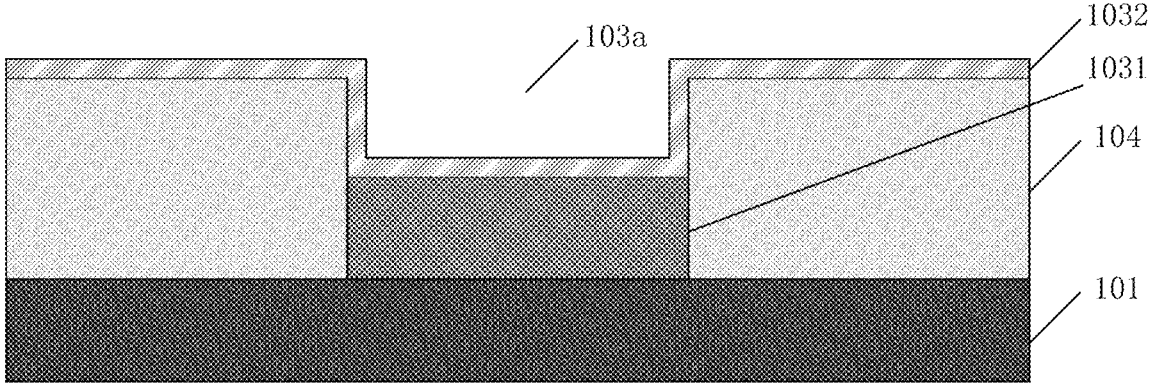
FIG. 9 is a schematic cross-sectional diagram showing a semiconductor integrated circuit device in a certain phase of a manufacturing process according to an embodiment of the present disclosure.

Step S460, deposit a resistive material in the second recess 103a to form a resistive layer 1032 having a trench structure to obtain a structure shown in FIG. 9.

When depositing the resistive material in the second recess 103a to form the resistive layer 1032 having a trench structure, any applicable resistive material can be deposited by means of any applicable deposition method.

Common resistive materials include hafnium oxide (HfOx), aluminum oxide (AlOx), aluminum hafnium oxide (HfAlO), tantalum oxide (TaOx), etc.

In addition, when depositing the resistive layer 1032, a single layer of resistive material may be deposited, or a plurality of resistive materials may be deposited layer by layer to form the resistive layer 1032. In the embodiments of the present disclosure, the specific structure and manufacturing process of the resistive layer are not limited.

Figure 10:
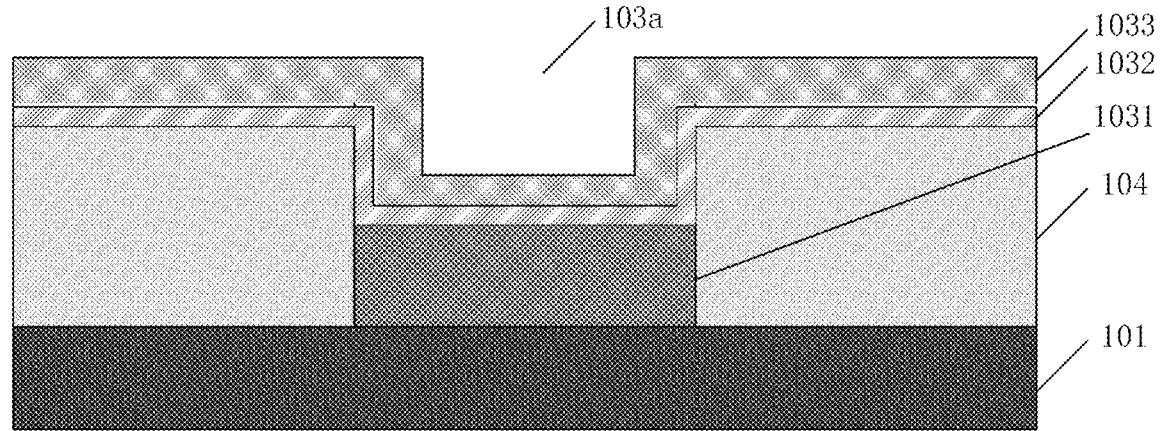
FIG. 10 is a schematic cross-sectional diagram showing a semiconductor integrated circuit device in a certain phase of a manufacturing process according to an embodiment of the present disclosure.

In an implementation, before depositing the second electrode material on the resistive layer 1032 to form the second electrode 1034, the method further includes: deposit an oxygen getting layer material on the resistive layer 1032 to form an oxygen getting layer 1033 to obtain a structure shown in FIG. 10.

Usually, before depositing the electrode material to obtain the second electrode, the oxygen getting layer is formed by means of the physical vapor deposition or chemical vapor deposition method to attract or store more oxygen and make the formation of conductive filaments more stable. Common materials of the oxygen getting layer mainly include titanium (Ti), tantalum (Ta), etc.

It should be noted that the oxygen getting layer 1033 is not a necessary structure for implementing the semiconductor integrated circuit device of the present disclosure, but is a gain structure for improving the product performance.

Step S470, deposit a second electrode material on the resistive layer 1032 to form a second electrode 1034, and make the second electrode 1034 opposite to the first electrode 1031.

Figure 11:
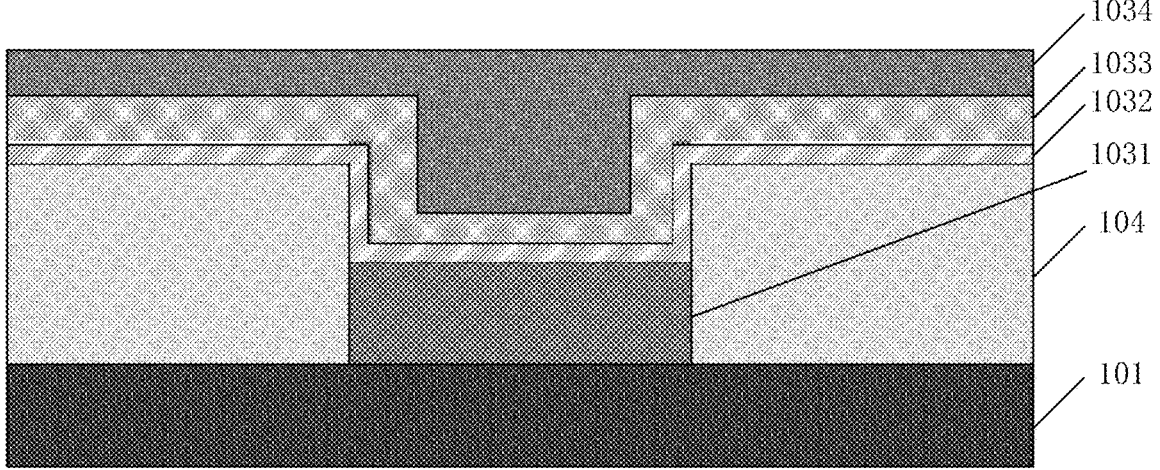
FIG. 11 is a schematic cross-sectional diagram showing a semiconductor integrated circuit device in a certain phase of a manufacturing process according to an embodiment of the present disclosure.

If the oxygen getting layer material is first deposited on the resistive layer 1032 to form the oxygen getting layer 1033 before depositing the second electrode material on the resistive layer 1032 to form the second electrode 1034, in step S470, the second electrode material is deposited on the oxygen getting layer 1033 to form the second electrode 1034 to obtain a structure shown in FIG. 11.

If no oxygen getting layer material is deposited before depositing the second electrode material on the resistive layer 1032 to form the second electrode 1034, the second electrode material can be directly deposited on the resistive layer 1032 to form the second electrode 1034 to obtain a structure without the oxygen getting layer 1033 similar to that in FIG. 11.

When depositing the second electrode material to obtain the second electrode 1034, any applicable one or several electrode materials can be deposited by means of any applicable deposition method. Common deposition processes include chemical vapor deposition, physical vapor deposition, atomic layer deposition, etc. Common electrode materials include titanium (Ti), tantalum (Ta), titanium nitride (TiN), tantalum nitride (TaN), etc.

The electrode layer obtained by means of the chemical vapor deposition or atomic deposition process has an amorphous structure and a relatively flat surface. Therefore, it is recommended to deposit the second electrode material on the resistive layer by means of the chemical vapor deposition process or the atomic deposition process to obtain the second electrode 1034.

In addition, since the RRAM is usually formed by a plurality of RRAM cells, and the RRAM cells need to be insulated from each other. Therefore, after the structure (with or without the oxygen getting layer 1033) similar to that shown in FIG. 11 is obtained, it is necessary to pattern the RRAM cell. For example, photolithography and etching are successively performed according to a pre-designed pattern or shape, or a polishing tool is directly applied to remove a non-essential structure at the upper end.

However, usually, if the etching is performed in the vertical direction, since different types of films need to be etched, dry etching is likely to etch uncleanly, and the remaining metal films may cause a short circuit. Therefore, it is more recommended to remove, after depositing the second electrode material on the resistive layer, the structure on the dielectric layer 104 by means of polishing to form the second electrode 1034, and make the RRAM cell flush with the dielectric layer 104 to obtain a semiconductor integrated circuit device shown in FIG. 3.

In this way, the obtained semiconductor integrated circuit device has a lower height, a smaller volume and a tighter structure, and can better meet the miniaturization requirements.

In an implementation, the structure on the dielectric layer may be removed by means of the CMP process.

The CMP process is a means to obtain global planarization in integrated circuit manufacturing. This process is specially designed to obtain a surface that is both flat and free from scratches and impurities. The surface of the semiconductor integrated circuit device obtained through this process is flatter, and the resistive performance of the RRAM is more uniform.

It should be noted that terms "including", "comprising" or any other variants thereof are intended to cover non-exclusive inclusion such that a process, method, article, or apparatus including a series of elements includes not only those elements but also other elements not explicitly listed, or elements inherent to such a process, method, article, or apparatus. Without further limitation, an element qualified by the phrase "including a . . . " does not exclude the presence of an additional identical element in the process, method, article, or apparatus including the element.

In several embodiments provided in the present disclosure, it should be understood that the disclosed device and method may be implemented in other manners. For example, the described device example is merely an example. For example, the unit division is merely logical function division and may be other division in actual implementation. For example, a plurality of units or components may be combined or integrated into another device, or some features may be ignored or not performed. In addition, the intercoupling or direct coupling or communication connection shown or discussed may be indirect coupling or communication connection through some interfaces, devices, or units; or may be implemented in electrical, mechanical, or other forms.

The above merely describes specific implementations of the present disclosure, but the protection scope of the present disclosure is not limited thereto. Any person skilled in the art can easily conceive modifications or replacements within the technical scope of the present disclosure, and these modifications or replacements shall fall within the protection scope of the present disclosure. Therefore, the protection scope of the present disclosure shall be subject to the protection scope of the claims.

What is claimed is:

1. A semiconductor integrated circuit device, comprising:
a first metal layer; and
a resistive random-access memory (RRAM) cell comprising a resistive layer, a first electrode, and a second electrode, wherein the resistive layer has a trench structure, the first electrode and the second electrode are respectively located on upper and lower sides of the trench structure and are opposite to each other, the first electrode is directly connected to the first metal layer, and a length of the second electrode is less than a length of the first electrode;
wherein the resistance layer is made of aluminum-hafnium oxide (HfAlO).

2. The semiconductor integrated circuit device according to claim 1, wherein a material of the first electrode comprises at least one of titanium, tantalum, titanium nitride, or tantalum nitride.

3. The semiconductor integrated circuit device according to claim 1, wherein the RRAM cell further comprises:
an oxygen getting layer located between the resistive layer and the second electrode.

4. A method for manufacturing a semiconductor integrated circuit device, comprising:
obtaining a substrate having a first metal layer;
depositing a dielectric material on the first metal layer to form a dielectric layer;
etching the dielectric layer to form a first recess;
depositing a first electrode material in the first recess such that the first electrode material is directly connected to the first metal layer;
etching the first electrode material such that the first electrode material is lower than a top of the first recess to form a first electrode, and forming a second recess on the first electrode;

depositing a resistive material in the second recess to form a resistive layer having a trench structure; and
depositing a second electrode material on the resistive layer to form a second electrode, and making the second electrode opposite to the first electrode, wherein a length of the second electrode is less than a length of the first electrode;
wherein the resistance layer is made of HfAlO.

5. The method according to claim 4, wherein the depositing the first electrode material in the first recess comprises:
depositing the first electrode material in the first recess by means of a chemical vapor deposition process or an atomic deposition process.

6. The method according to claim 4, before depositing the second electrode material on the resistive layer to form the second electrode, further comprising:
depositing an oxygen getting layer material on the resistive layer to form an oxygen getting layer;
correspondingly, the depositing the second electrode material on the resistive layer to form the second electrode comprises:
depositing the second electrode material on the oxygen getting layer to form the second electrode.

7. The method according to claim 4, wherein the depositing the second electrode material on the resistive layer to form the second electrode comprises:
depositing the second electrode material on the resistive layer; and
removing a structure on the dielectric layer to form the second electrode, and making a resistive random-access memory (RRAM) cell flush with the dielectric layer.

8. The method according to claim 7, wherein the depositing the second electrode material on the resistive layer comprises:
depositing the second electrode material on the resistive layer by means of a chemical vapor deposition process or an atomic deposition process.

9. The method according to claim 7, wherein the removing the structure on the dielectric layer comprises:
removing the structure on the dielectric layer by means of a chemical mechanical polishing (CMP) process.

10. The semiconductor integrated circuit device according to claim 1, wherein the first metal layer is a metal layer formed by various circuits carried on a substrate, or is a metal layer formed by components in other semiconductor integrated circuit devices in a stacked structure.

11. The semiconductor integrated circuit device according to claim 10, wherein a dielectric layer is formed above the first metal layer, a first recess is formed in the dielectric layer, and the RRAM cell is set in the first recess.

12. The method according to claim 4, wherein the first metal layer is a metal layer formed by various circuits carried on a substrate, or is a metal layer formed by components in other semiconductor integrated circuit devices in a stacked structure.

* * * * *